(12) United States Patent
Ma et al.

(10) Patent No.: US 11,647,658 B2
(45) Date of Patent: May 9, 2023

(54) COLOR SHIFT COMPENSATION METHOD, DISPLAY PANEL AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Qun Ma, Beijing (CN); Yuqing Yang, Beijing (CN); Qiang Huang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 331 days.

(21) Appl. No.: 16/760,880

(22) PCT Filed: Jun. 28, 2019

(86) PCT No.: PCT/CN2019/093623
§ 371 (c)(1),
(2) Date: Apr. 30, 2020

(87) PCT Pub. No.: WO2020/258230
PCT Pub. Date: Dec. 30, 2020

(65) Prior Publication Data
US 2021/0408158 A1    Dec. 30, 2021

(51) Int. Cl.
*H01L 27/32* (2006.01)

(52) U.S. Cl.
CPC ...... *H01L 27/3218* (2013.01); *H01L 27/3246* (2013.01); *G09G 2300/0465* (2013.01); *G09G 2320/0242* (2013.01); *G09G 2330/12* (2013.01)

(58) Field of Classification Search
CPC ............ H01L 27/3246; H01L 27/3218; G09G 2330/12; G09G 2320/0242; G09G 2300/0465
See application file for complete search history.

(56) References Cited

U.S. PATENT DOCUMENTS

| 2018/0040676 A1* | 2/2018 | Hack ................. G02B 27/0172 |
| 2018/0076270 A1* | 3/2018 | Kwon ................ H01L 51/0097 |
| 2018/0366683 A1  | 12/2018 | Zhang et al. |

FOREIGN PATENT DOCUMENTS

| CN | 202649645 A | 1/2013 |
| CN | 107275514 A | 10/2017 |

(Continued)

*Primary Examiner* — Peter Bradford
(74) *Attorney, Agent, or Firm* — McCoy Russell LLP

(57) ABSTRACT

A color shift compensation method, a display panel and a display device are provided. The color shift compensation method includes: acquiring color shift information generated with respect to a test region of a test display panel when the test region is viewed at a first viewing angle, at least a part of first subpixel units within the test region being provided with a test aperture ratio; and controlling, in accordance with the color shift information, at least a part of second subpixel units within a target region of a to-be-manufactured target display panel to be provided with a target aperture ratio being different from the test aperture ratio, to improve color shift within the target region when the target region is viewed at the first viewing angle, wherein a position of the target region on the target display panel is same as a position of the test region on the test display panel, and positions of at least the part of second subpixel units within the target region are same as positions of at least the part of first subpixel units within the test region.

18 Claims, 2 Drawing Sheets

(56) References Cited

FOREIGN PATENT DOCUMENTS

| CN | 108922964 | A |   | 11/2018 | |
|----|-----------|---|---|---------|--|
| CN | 109904200 | A |   | 6/2019  | |
| CN | 111599938 | A | * | 8/2020  | .......... H01L 27/3211 |
| KR | 20180079045 | A |   | 7/2018  | |

* cited by examiner

US 11,647,658 B2

COLOR SHIFT COMPENSATION METHOD, DISPLAY PANEL AND DISPLAY DEVICE

CROSS-REFERENCE TO RELATED APPLICATIONS

The present application is the U.S. national phase of PCT Application No. PCT/CN2019/093623 filed on Jun. 28, 2019, the disclosure of which is incorporated herein by reference in its entirety.

TECHNICAL FIELD

The present disclosure relates to the field of display technology, in particular to a color shift compensation method, a display panel and a display device.

BACKGROUND

Along with the development of the display technology, Organic Light-Emitting Diode (OLED) display devices have been applied in various fields due to such advantages as rapid response, high contrast and flexibility. However, there is such a phenomenon as color shift in the OLED display device.

SUMMARY

An object of the present disclosure is to provide a color shift compensation method, a display panel and a display device.

In one aspect, the present disclosure provides in some embodiments a color shift compensation method, including: acquiring color shift information generated with respect to a test region of a test display panel when the test region is viewed at a first viewing angle, at least a part of first subpixel units within the test region being provided with a test aperture ratio; and controlling, in accordance with the color shift information, at least a part of second subpixel units within a target region of a to-be-manufactured target display panel to be provided with a target aperture ratio being different from the test aperture ratio, to improve color shift within the target region when the target region is viewed at the first viewing angle, wherein a position of the target region on the target display panel is same as a position of the test region on the test display panel, and positions of at least the part of second subpixel units within the target region are same as positions of at least the part of first subpixel units within the test region In a possible embodiment of the present disclosure, the acquiring the color shift information generated with respect to the test region of the test display panel when the test region is viewed at the first viewing angle includes: determining brightness attenuation ratios corresponding to the subpixel units in different colors within the test region when the test region is viewed at the first viewing angle.

In a possible embodiment of the present disclosure, the controlling, in accordance with the color shift information, at least the part of second subpixel units within the target region of the to-be-manufactured target display panel to be provided with the target aperture ratio includes: controlling at least the part of second subpixel units within the target region to be provided with the target aperture ratio in accordance with the brightness attenuation ratios corresponding to the subpixel units in different colors within the test region, to enable the brightness attenuation ratios corresponding to the subpixel units in different colors within the target region to be same when the target region is viewed at the first viewing angle.

In a possible embodiment of the present disclosure, the target display panel includes a pixel definition layer configured to define a plurality of aperture regions, and the subpixel units of the target display panel are arranged within the respective aperture regions in one-to-one correspondence. The controlling at least the part of the second subpixel units within the target region to be provided with the target aperture ratio in accordance with the brightness attenuation ratios corresponding to the subpixel units in different colors within the test region includes: controlling at least a part of the aperture regions defined by the pixel definition layer within the target region to be provided with a target size in accordance with the brightness attenuation ratios corresponding to the subpixel units in different colors within the test region, to enable at least the part of second subpixel units within at least the part of the aperture regions to be provided with the target aperture ratio In a possible embodiment of the present disclosure, the controlling at least the part of second subpixel units within the target region to be provided with the target aperture ratio in accordance with the brightness attenuation ratios corresponding to the subpixel units in different colors within the test region includes: when the brightness attenuation ratio corresponding to the first subpixel unit is minimum among the brightness attenuation ratios corresponding to the subpixel units in different colors within the test region, controlling the second subpixel unit within the target region to be provided with the target aperture ratio being smaller than the test aperture ratio of the first subpixel unit.

In a possible embodiment of the present disclosure, at least red subpixel units, green subpixel units and blue subpixel units are arranged within each of the test region and the target region. Both the first subpixel units and the second subpixel units include the red subpixel units; or both the first subpixel units and the second subpixel units include the green subpixel units; or both the first subpixel units and the second subpixel units include the blue subpixel units.

In a possible embodiment of the present disclosure, the test display panel includes a test flat-surface display region and a test curved-surface display region, and the test region includes the test flat-surface display region or the test curved-surface display region. The acquiring the color shift information generated with respect to the test region of the test display panel when the test region is viewed at the first viewing angle includes: determining a viewing angle at which the test region is viewed and a bending angle corresponding to the test region, the bending angle including an angle of a middle tangent plane of a curved surface corresponding to the test region relative to a plane corresponding to the test flat-surface display region; acquiring the first viewing angle in accordance with the viewing angle and the bending angle; and acquiring the color shift information generated with respect to the test region when the test region is viewed at the first viewing angle.

In a possible embodiment of the present disclosure, the acquiring the first viewing angle in accordance with the viewing angle and the bending angle includes: acquiring the first viewing angle through adding the viewing angle to the bending angle.

In a possible embodiment of the present disclosure, when the test region includes the test flat-surface display region, the bending angle is 0°, and the first viewing angle is equal to the viewing angle.

In a possible embodiment of the present disclosure, when the test region includes the test curved-surface display region, determining that the viewing angle at which the test curved-surface display region is viewed is 0°, and the first viewing angle is equal to the bending angle.

In another aspect, the present disclosure provides in some embodiments a display panel based on the solution of the above color shift compensation method. At least a part of second subpixel units within a target region of the display panel is provided with a target aperture ratio, to enable brightness attenuation ratios corresponding to subpixel units in different colors within the target region to be the same when the target region is viewed at a first viewing angle, to improve color shift within the target region when the target region is viewed at the first viewing angle.

In a possible embodiment of the present disclosure, the display panel includes a pixel definition layer configured to define a plurality of aperture regions, wherein the subpixel units of the display panel are arranged within the respective aperture regions in one-to-one correspondence, and at least a part of the aperture regions defined by the pixel definition layer within the target region is provided with a target size, to enable at least the part of second subpixel units within at least the part of the aperture regions to be provided with the target aperture ratio.

In a possible embodiment of the present disclosure, at least a red subpixel unit, a green subpixel unit and a blue subpixel unit are arranged within the target region. The red subpixel unit within the target region is provided with the target aperture ratio; or the green subpixel unit within the target region is provided with the target aperture ratio; or the blue subpixel unit within the target region is provided with the target aperture ratio.

In a possible embodiment of the present disclosure, the display panel includes a target flat-surface display region and a target curved-surface display region, and the target region includes the target flat-surface display region or the target curved-surface display region. The first viewing angle includes a sum of a viewing angle at which the target region is viewed and a bending angle corresponding to the target region, and the bending angle is an angle of a middle tangent plane of a curved surface corresponding to the target region relative to a plane corresponding to the target flat-surface display region.

In a possible embodiment of the present disclosure, when the target region includes the target flat-surface display region, the bending angle is 0°, and the first viewing angle is equal to the viewing angle.

In a possible embodiment of the present disclosure, when the target region includes the target curved-surface display region, the viewing angle at which the target curved-surface display region is viewed is 0°, and the first viewing angle is equal to the bending angle.

In yet another aspect, the present disclosure provides in some embodiments a display device including the above-mentioned display panel.

BRIEF DESCRIPTION OF THE DRAWINGS

The following drawings are provided to facilitate the understanding of the present disclosure, and constitute a portion of the description. The following embodiments and explanations thereof are for illustrative purposes only, but shall not be construed as limiting the present disclosure. In these drawings.

DETAILED DESCRIPTION

Figure 1:
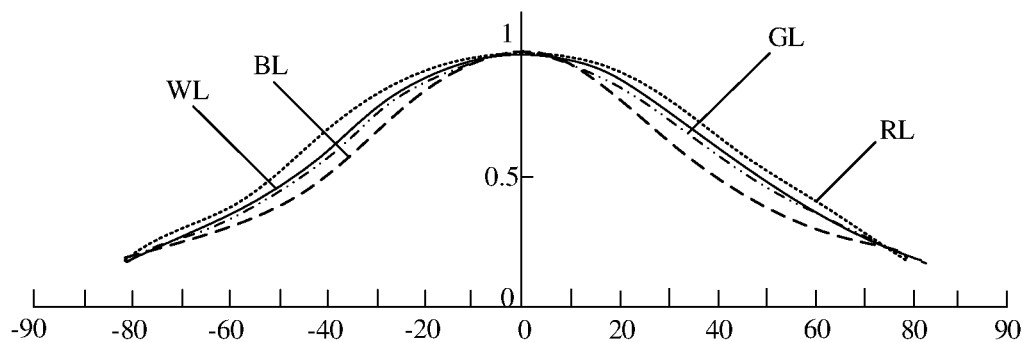
FIG. 1 is a curve diagram of brightness attenuation corresponding to different subpixel units at different viewing angles according to an embodiments of the present disclosure.

The color shift compensation method, the display panel and the display device of present disclosure will be described hereinafter in conjunction with the drawings and embodiments.

In the related art, in order to meet the requirements in an actual application scenario, usually an Organic Light-Emitting Diode (OLED) display device is provided with a curved-surface screen. When the curved-surface screen is viewed by a viewer, such a phenomenon as color shift may occur at some regions, and thereby the user experience may be adversely affected. In this regard, it is found, through research, that, when a target region of the display device is viewed by the viewer, brightness attenuation degrees corresponding to subpixel units in different colors may be different due to differences of viewing angles and bending angles of the curved-surface screen within the target region, so the color shift may occur for an image displayed within the target region and viewed by the viewer.

It is further found that, the bending angle of the curved-surface screen of the display device is predetermined at each position during the manufacture of the display device, so a test display device may be manufactured in advance in accordance with the practical need, and then a target region of the test display device may be viewed at different viewing angles so as to determine a relationship among the viewing angles, the bending angles within the target region, and the color shift within the target region. Then, an aperture ratio of each subpixel unit within the target region of the to-be-manufactured display device may be adjusted in accordance with the relationship, so as to compensate for the color shift and improve the user experience.

The present disclosure provides in some embodiments a color shift compensation method, which includes: acquiring color shift information generated with respect to a test region of a test display panel when the test region is viewed at a first viewing angle, at least a part of first subpixel units within the test region being each provided with a test aperture ratio; and controlling at least a part of second subpixel units within a target region of a to-be-manufactured target display panel to be provided with a target aperture ratio different from the test aperture ratio in accordance with the color shift information, so as to improve color shift within the target region when the target region is viewed at the first viewing angle. A position of the target region on the target display panel is the same as a position of the test region on the test display panel, and positions of at least the part of second subpixel units within the target region are the same as positions of at least the part of first subpixel units within the test region.

To be specific, during the manufacture of the display panel, i.e., the target display panel, such parameters of the display panel as an actual size, a bending positions and bending angles have been predetermined. Hence, at a development stage of the target display panel, the test display panel may be manufactured using a conventional method in accordance with the parameters such as the predetermined size, bending positions and bending angles, and at least the part of first subpixel units within the test region of the test display panel may have a test aperture ratio. Then, the test region of the test display panel may be viewed at the first viewing angle so as to acquire the color shift information generated with respect to the test region. The color shift information is used to represent color shift condition for an image displayed within the test region of the test display panel when the test region is viewed at the first viewing angle, and color shift compensation modes for different color shift conditions. For example, when the color shift information represents that the image displayed within the test region of the test display panel is reddish, it is necessary to reduce an aperture ratio of each red subpixel unit within the test region of the test display panel to the target aperture ratio; or when the color shift information represents that the image displayed within the test region of the test display panel is greenish, it is necessary to reduce an aperture ratio of each green subpixel unit within the test region of the test display panel to the target aperture ratio. In the above two cases, the first subpixel unit may be just the red subpixel unit or the green subpixel unit.

Upon the acquisition of the color shift information, the aperture ratio of the second subpixel units within the target region of the to-be-manufactured target display panel may be determined in accordance with the color shift information. For example, at least a part of the second subpixel units within the target region of the to-be-manufactured target display panel may be controlled to have the target aperture ratio which is different from the test aperture ratio of at least the part of first subpixel units, and then the subpixel units of the target display panel other than the at least part of second subpixel units may be controlled to have same aperture ratios as the aperture ratios of the subpixel units of the test display panel other than at least the part of first subpixel units respectively, so as to improve the color shift within the target region when the target region is viewed at the first viewing angle.

It should be appreciated that, the test display panel may have a same size, same bending positions and same bending angles as the target display panel. The subpixel units of the test display panel may correspond to the subpixel units of the target display panel respectively in the one-to-one correspondence, and each subpixel unit of the test display panel may be arranged at a same position and have a same color as the corresponding subpixel unit of the target display panel. In addition, the position of the target region on the target display panel may be the same as the position of the test region on the test display panel, and the positions of at least the part of second subpixel units within the target region may be the same as the positions of at least the part of first subpixel units within the test region. Furthermore, in actual use, the first viewing angle at which the target region of the target display panel is viewed may be the same as the first viewing angle at which the test region of the test display panel.

According to the color shift compensation method in the embodiments of the present disclosure, the color shift information generated in correspondence to the test region of the test display panel may be acquired when the test region is viewed at the first viewing angle, and then based on the color shift information, at least the part of second subpixel units within the target region of the to-be-manufactured target display panel may be controlled to have the target aperture ratio. As a result, it is able to improve the color shift within the target region during the display, and thus relieve or eliminate the color shift when the target display region of the target display panel is viewed by the viewer at the first viewing angle, thereby to improve the user experience.

In some embodiments of the present disclosure, the acquiring the color shift information generated with respect to the test region of the test display panel when the test region is viewed at the first viewing angle may include: determining brightness attenuation ratios corresponding to subpixel units in different colors within the test region of the test display panel when the test region is viewed at the first viewing angle. The controlling at least the part of second subpixel units within the target region of the to-be-manufactured target display panel to be provided with the target aperture ratio in accordance with the color shift information may include: controlling at least the part of second subpixel units within the target region to be provided with the target aperture ratio in accordance with the brightness attenuation ratios corresponding to the subpixel units in different colors within the test region, so as to enable the brightness attenuation ratios corresponding to the subpixel units in different colors within the target region to be same when the target region is viewed at the first viewing angle.

To be specific, the acquiring the color shift information generated with respect to the test region of the test display panel when the test region is viewed at the first viewing angle may include: determining the brightness attenuation ratio of the subpixel units in different colors within the test region of the test display panel at different viewing angles. For example, when the subpixel units within the target region of the test display panel include red subpixel units, green subpixel units, blue subpixel units and white subpixel units, as shown in FIG. 1 (where an abscissa represents the first viewing angle and an ordinate represents the brightness attenuation ratios corresponding to the subpixel units in different colors), RL represents a brightness attenuation curve corresponding to the red subpixel unit, GL represents a brightness attenuation curve corresponding to the green subpixel unit, BL represents a brightness attenuation curve corresponding to the blue subpixel unit, and WL represents a brightness attenuation curve corresponding to the white subpixel unit.

After determining the brightness attenuation ratios corresponding to the subpixel units in different colors within the test region when the test region of the test display panel is viewed at the first viewing angle, aperture ratio compensation information about the subpixel units in different colors within the test region may be determined in accordance with the brightness attenuation ratios corresponding to the subpixel units in different colors within the test region of the test display panel, and at least the part of second subpixel units within the target region may be controlled to be provided with the target aperture ratio in accordance with the aperture ratio compensation information.

More specifically, in the case that the test region is viewed at the first viewing angle, when the brightness attenuation ratio corresponding to the subpixel units in a certain color (i.e., the first subpixel units) within the test region is smaller than the brightness attenuation ratio corresponding to the subpixel units in another color within the test region, determining the aperture ratio compensation information may include: reducing the aperture ratio of the subpixel units in the certain color (i.e., the second subpixel units) within the target region of the target display panel to a first target aperture ratio, or increasing the aperture ratio of the subpixel units in the other color within the target region of the target display panel to a second target aperture ratio, so as to enable the brightness attenuation ratio corresponding to the second subpixel units when the target region is viewed at the first viewing angle to be the same as, or approach to, the brightness attenuation ratio corresponding to the subpixel units in the other color within the target region. As a result, when the target region is viewed at the first viewing angle, the subpixel units in different colors within the target region may have the same or similar brightness attenuation ratio.

For example, Table 1 shows a correspondence between brightness changes of the red subpixel units (i.e., the second subpixel units) within the target region of the target display panel and the target aperture ratios of the red subpixel units at different viewing angles.

TABLE 1

| First viewing angle (°) | Brightness change | Target aperture ratio |
|---|---|---|
| 0 | 0 | 5.98% |
| 10 | 5% | 5.68% |
| 20 | 10% | 5.38% |
| 30 | 20% | 4.92% |

In Table 1, the brightness change represents a brightness attenuation percentage, and the target aperture ratio is just the target aperture ratio of the red subpixel units within the target region of the target display panel.

Figure 2:
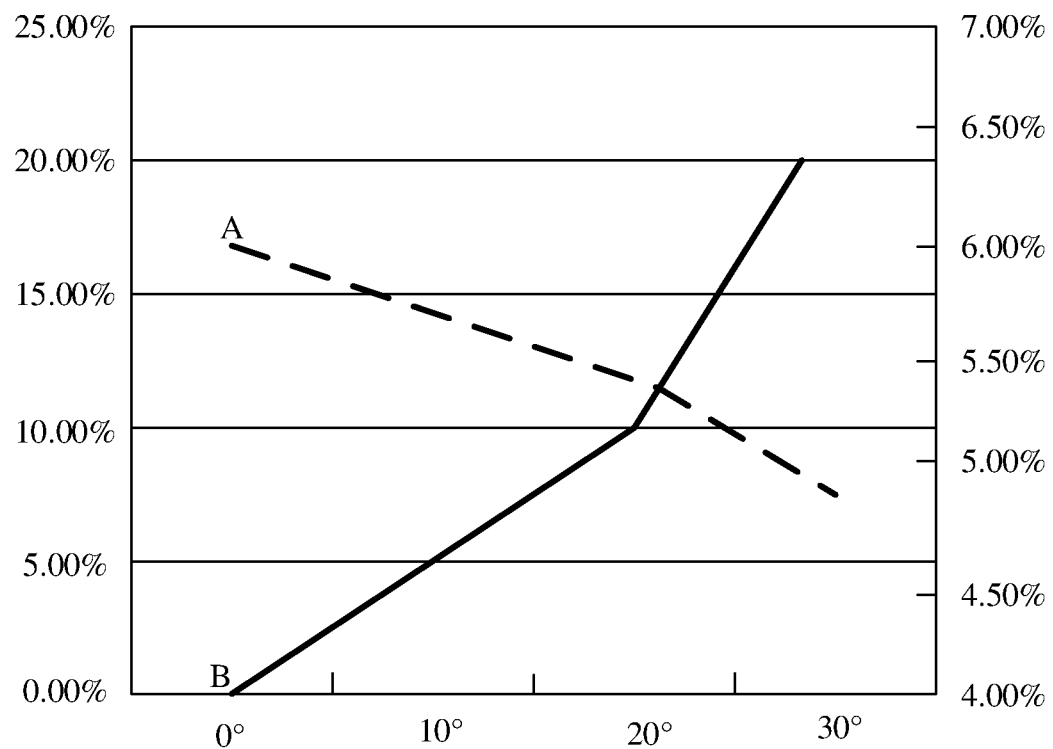
FIG. 2 is a schematic view showing a compensation relationship between display brightness values and aperture ratios corresponding to the subpixel units at different viewing angles according to an embodiments of the present disclosure.

In FIG. 2 (where the abscissa represents the first viewing angle, an ordinate on the right represents the aperture ratio of the red subpixel units within the test region of the test display panel, and an ordinate on the left represents a display brightness value of the red subpixel units within the test region of the test display panel), A represents an aperture ratio compensation change curve of the red subpixel units at different first viewing angles, and B represents a display brightness curve of the red subpixel units at different first viewing angles. As shown in FIG. 2, along with an increase in the first viewing angle, the brightness value of the red subpixel units may increase gradually, and correspondingly the aperture ratio of the red subpixel units may decrease gradually.

In the above-mentioned color shift compensation method, at least the part of second subpixel units within the target region may be controlled to be provided with the target aperture ratio in accordance with the brightness attenuation ratios corresponding to the subpixel units in different colors within the test region of the test display panel when the test region is viewed at the first viewing angle, so as to enable the subpixel units in different colors within the target region to have the same brightness attenuation ratio when the target region is viewed at the first viewing angle, thereby to improve the color shift within the target region when the target region of the target display panel is viewed at the first viewing angle.

In some embodiments of the present disclosure, the target display panel may include a pixel definition layer configured to define a plurality of aperture regions, and the subpixel units of the target display panel may be arranged within the respective aperture regions in one-to-one correspondence. The controlling at least the part of the second subpixel units within the target region to be provided with the target aperture ratio in accordance with the brightness attenuation ratios corresponding to the subpixel units in different colors within the test region may include: controlling at least a part of the aperture regions defined by the pixel definition layer within the target region to be provided with a target size in accordance with the brightness attenuation ratios corresponding to the subpixel units in different colors within the test region, so as to enable at least the part of second subpixel units within at least the part of the aperture regions to be provided with the target aperture ratio.

To be specific, taking an OLED display panel as an example, during the formation of the subpixel units of the display panel, usually the pixel definition layer may be formed so as to define the plurality of aperture regions corresponding to the subpixel units respectively, and then the subpixel units may be formed within the respective aperture regions. Hence, the aperture ratio of each subpixel unit may depend on a size of the corresponding aperture region.

According to the color shift compensation method in the embodiments of the present disclosure, at least the part of aperture regions defined by the pixel definition layer within the target region may be controlled to have the target size in accordance with the brightness attenuation ratios corresponding to the subpixel units in different colors within the test region, so as to enable at least the part of second subpixel units formed within at least the part of aperture regions to be provided with the target aperture ratio. As a result, through the above-mentioned color shift compensation method, during the formation of the second subpixel units within the target region of the target display panel, it is able to effectively compensate for the aperture ratio of the second subpixel units, thereby to improve the color shift within the target region of the target display panel when the target region is viewed at the first viewing angle.

In some embodiments of the present disclosure, the controlling at least the part of second subpixel units within the target region to be provided with the target aperture ratio in accordance with the brightness attenuation ratios corresponding to the subpixel units in different colors within the test region may include, when a brightness attenuation ratio corresponding to the first subpixel units is minimum in the brightness attenuation ratios corresponding to the subpixel units in different colors within the test region, controlling the second subpixel units within the target region to be provided with the target aperture ratio smaller than the test aperture ratio of the first subpixel units.

Further, at least red subpixel units, green subpixel units and blue subpixel units may be arranged within each of the test region and the target region. Both the first subpixel units and the second subpixel units may include the red subpixel units, or may include the green subpixel units, or may include the blue subpixel units.

To be specific, when the brightness attenuation ratio corresponding to the red subpixel units is minimum in the brightness attenuation ratios corresponding to the subpixel units in different colors within the test region, the red subpixel units within the target region may be controlled to be provided with the target aperture ratio which is smaller than the aperture ratio of the red subpixel units within the test region; or when the brightness attenuation ratio corresponding to the green subpixel units is minimum in the brightness attenuation ratios corresponding to the subpixel units in different colors within the test region, the green subpixel units within the target region may be controlled to be provided with the target aperture ratio which is smaller than the aperture ratio of the green subpixel units within the test region; or when the brightness attenuation ratio corresponding to the blue subpixel units is minimum in the brightness attenuation ratios corresponding to the subpixel units in different colors within the test region, the green subpixel units within the target region may be controlled to be provided with the target aperture ratio which is smaller than the aperture ratio of the blue subpixel units within the test region.

More specifically, when the brightness attenuation ratio corresponding to the red subpixel units is minimum in the brightness attenuation ratios corresponding to the subpixel units in different colors within the test region, a reddish image may be viewed at the first viewing angle within the test region of the test display panel, so the red subpixel units within the target region may be controlled to be provided with the target aperture ratio which is smaller than the aperture ratio of the red subpixel units within the test region, so as to reduce a luminous brightness value of each red subpixel unit within the target region, thereby to enable the brightness attenuation ratios corresponding to the subpixel units in different colors within the target region of the target display panel to be the same when the subpixel units in different colors within the target region is viewed at the first viewing angle. As a result, it is able to prevent the image displayed within the target region from being reddish when the target region of the target display panel is viewed at the first viewing angle.

When the brightness attenuation ratio corresponding to the green subpixel units is minimum in the brightness attenuation ratios corresponding to the subpixel units in different colors within the test region, a greenish image may be viewed at the first viewing angle within the test region of the test display panel, so the green subpixel units within the target region may be controlled to be provided with the target aperture ratio which is smaller than the aperture ratio of the green subpixel units within the test region, so as to reduce a luminous brightness value of each green subpixel unit within the target region, thereby to enable the brightness attenuation ratios corresponding to the subpixel units in different colors within the target region of the target display panel to be the same when the subpixel units in different colors within the target region is viewed at the first viewing angle. As a result, it is able to prevent the image displayed within the target region from being greenish when the target region of the target display panel is viewed at the first viewing angle.

When the brightness attenuation ratio corresponding to the blue subpixel units is minimum in the brightness attenuation ratios corresponding to the subpixel units in different colors within the test region, a bluish image may be viewed at the first viewing angle within the test region of the test display panel, so the blue subpixel units within the target region may be controlled to be provided with the target aperture ratio which is smaller than the aperture ratio of the blue subpixel units within the test region, so as to reduce a luminous brightness value of each blue subpixel unit within the target region, thereby to enable the brightness attenuation ratios corresponding to the subpixel units in different colors within the target region of the target display panel to be the same when the subpixel units in different colors within the target region is viewed at the first viewing angle. As a result, it is able to prevent the image displayed within the target region from being bluish when the target region of the target display panel is viewed at the first viewing angle.

In some embodiments of the present disclosure, the test display panel may include a test flat-surface display region and a test curved-surface display region, and the test region may include the test flat-surface display region or the test curved-surface display region. The acquiring the color shift information generated with respect to the test region of the test display panel when the test region is viewed at the first viewing angle may include: determining a viewing angle at which the test region is viewed and a bending angle corresponding to the test region, the bending angle includes an angle of a middle tangent plane of a curved surface corresponding to the test region relative to a plane corresponding to the test flat-surface display region; acquiring the first viewing angle in accordance with the viewing angle and the bending angle; and acquiring the color shift information generated with respect to the test region when the test region is viewed at the first viewing angle.

To be specific, the test display panel may include the test flat-surface display region and the test curved-surface display region surrounding the test flat-surface display region. A surface of a display screen at the test flat-surface display region is flat, and a surface of the display screen at the test curved-surface display region is curved.

When the image displayed within the test region of the test display panel is viewed by the viewer, the generated color shift may be associated with the viewing angle at which the test region is viewed and the bending angle corresponding to the test region. The bending angle may be an angle of the middle tangent plane of the curved surface corresponding to the test region relative to the plane corresponding to the test flat-surface display region. Hence, upon the acquisition of the viewing angle and the bending angle, the first viewing angle may be acquired in accordance with the viewing angle and the bending angle, and then the color shift information generated with respect to the test region when the test region is viewed at the first viewing angle may be acquired.

As mentioned above, the first viewing angle may be acquired in accordance with the viewing angle and the bending angle, i.e., both the viewing angle of the viewer and the bending angle of the test region may be taken into consideration during the acquisition of the color shift information in accordance with the first viewing angle. In this way, when compensating for the second subpixel units within the target region of the target display panel in accordance with the color shift information, it is able to compensate for the color shift generated due to the viewing angle and the color shift generated due to the bending angle, thereby to more effectively compensate for the color shift of the target display panel, and thus further improve the user experience.

It should be appreciated that, a range of the first viewing angle may be determined according to the practical need. For example, the first viewing angle may be within a range from 0° to 30°, i.e., the color shift information generated with respect to the test region of the test display panel may be acquired at the viewing angle of 0° to 30°.

In some embodiments of the present disclosure, the acquiring the first viewing angle in accordance with the viewing angle and the bending angle may include: acquiring the first viewing angle through adding the viewing angle to the bending angle.

To be specific, when the test region of the test display panel is viewed by the viewer, the first viewing angle may be set as a sum of the viewing angle and the bending angle, and then the color shift information generated with respect to the test region of the test display panel may be acquired when the test region is viewed at the first viewing angle.

As mentioned above, the first viewing angle may be acquired through adding the viewing angle to the bending angle, so both the viewing angle and the bending angle of the test region may be taken into consideration during the acquisition of the color shift information in accordance with the first viewing angle. In this way, when compensating for the subpixel units within the target region of the target display panel in accordance with the color shift information, it is able to compensate for the color shift generated due to the viewing angle and the color shift generated due to the bending angle, thereby to more effectively compensate for the color shift of the target display substrate, and thus further improve the user experience.

In some embodiments of the present disclosure, when the test region includes the test flat-surface display region, the bending angle may be 0°, and the first viewing angle may be equal to the viewing angle.

To be specific, because the test flat-surface display region is flat, the bending angle corresponding to the test flat-surface display region may be 0°, i.e., the color shift viewed by the viewer may be merely associated with the viewing angle, and it may be determined that the viewing angle may be just the first viewing angle. Next, the color shift information generated with respect to the test flat-surface display region of the test display panel when the test flat-surface display region is viewed at the first viewing angle may be acquired. Then, the aperture ratio of the second subpixel units within the target flat-surface display region of the target display panel may be compensated in accordance with the color shift information, so as to prevent the occurrence of the color shift when the target flat-surface display region of the target display panel is viewed at the first viewing angle, thereby effectively improve the user experience.

In some embodiments of the present disclosure, when the test region includes the test curved-surface display region, it may determines that the viewing angle at which the test curved-surface display region is viewed may be 0°, and the first viewing angle may be equal to the bending angle.

To be specific, the viewing angle may be uncertain when the target curved-surface display region of the target display panel is viewed by the viewer. In order to prevent the uncertainty of the color shift information acquired when the test curved-surface display region of the test display panel is viewed at different viewing angles, the viewing angle may be set as 0° (i.e., the target curved-surface display region is viewed by the viewer in a direction vertical to the target curved-surface display region), i.e., the bending angle may be taken as the first viewing angle, and then the corresponding color shift information may be acquired in accordance with the first viewing angle.

More specifically, in the related art, the test display panel may include the test flat-surface display region and the test curved-surface display region with a bending angle. Tables 2 and 3 show the aperture ratios of the subpixel units at the test flat-surface display region and the test curved-surface display region respectively, where R represents the red subpixel unit, G represents the green subpixel unit, and B represents the blue subpixel unit.

TABLE 2

Test flat-surface display region

| Subpixel unit | R | G | B |
|---|---|---|---|
| Aperture ratio | 5.98% | 7.18% | 10.77% |

TABLE 3

Test curved-surface display region

| Subpixel unit | R | G | B |
|---|---|---|---|
| Aperture ratio | 5.98% | 7.18% | 10.77% |

Figure 3:
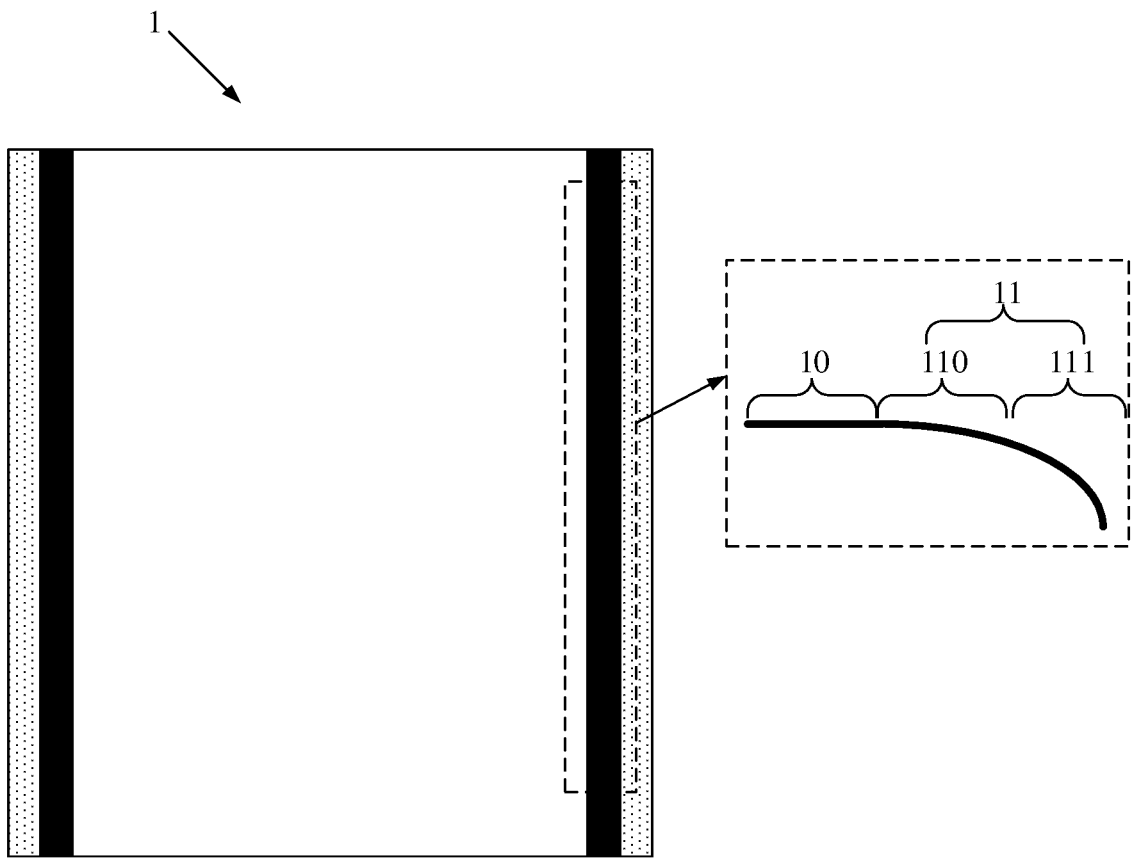
FIG. 3 is a schematic view showing a target flat-surface display region and a target curved-surface display region of a display panel according to an embodiments of the present disclosure.
Figure 4:
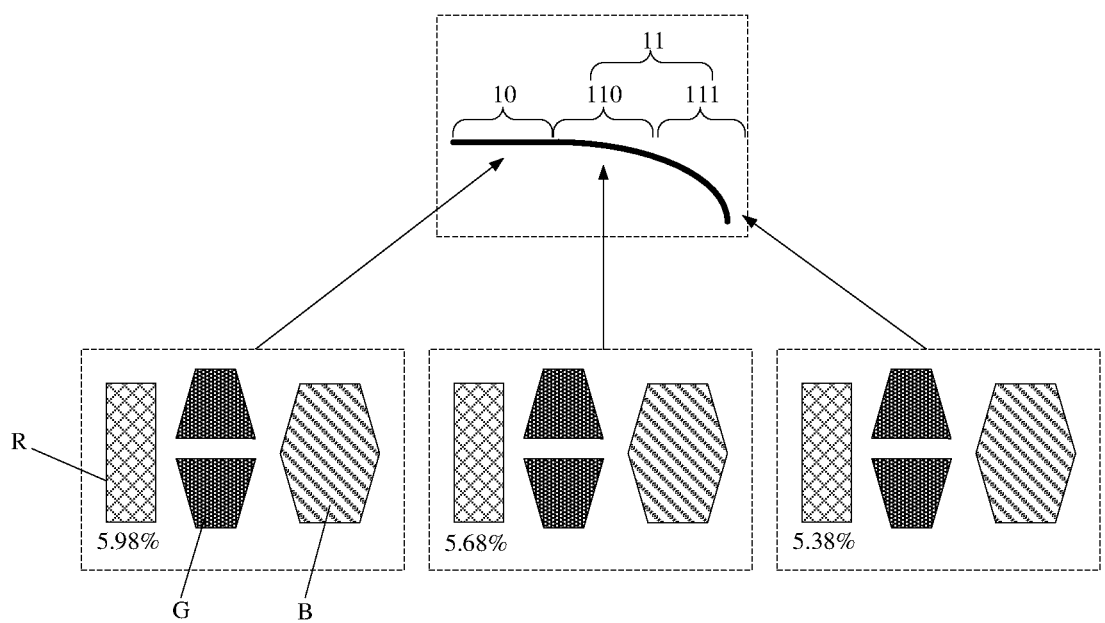
FIG. 4 is a schematic view showing target aperture ratios corresponding to the subpixel units of the display panel within the target region according to an embodiments of the present disclosure.

As shown in FIGS. 3 and 4, when the image viewed at the first viewing angle is reddish at the test curved-surface display region of the test display panel, the red subpixel units (i.e., the second subpixel units) at the target curved-surface display region 11 of the target display panel 1 may be compensated in accordance with the acquired color shift information, so as to enable the red subpixel units at different bending angles at the target curved-surface display region 11 to be provided with the target aperture ratio, as shown in Tables 4 to 6.

TABLE 4

Target flat-surface display region

| Subpixel unit | R | G | B |
|---|---|---|---|
| Aperture ratio | 5.98% | 7.18% | 10.77% |

TABLE 5

Target curved-surface display region (with a bending angle of 10°)

| Subpixel unit | R | G | B |
|---|---|---|---|
| Aperture ratio | 5.68% | 7.18% | 10.77% |

TABLE 6

Target curved-surface display region (with a bending angle of 20°)

| Subpixel unit | R | G | B |
|---|---|---|---|
| Aperture ratio | 5.38% | 7.18% | 10.77% |

As shown in Tables 4 to 6, the target aperture ratios of the subpixel units within the target flat-surface display region 10 of the target display panel 1 may not be adjusted, the aperture ratios of the red subpixel units R within a portion 110 of the target curved-surface display region 11 of the target display panel with a bending angle of 10° may be reduced by 0.3%, and the aperture ratios of the red subpixel units R within a portion 111 of the target curved-surface display region 11 of the target display panel 1 with a bending angle of 20° may be reduced by 0.6%. In this way, when the target curved-surface display region 11 of the target display panel 1 is viewed at the first viewing angle, the subpixel units in different colors within the target curved-surface display region 11 may have the same brightness attenuation ratio, so as to prevent the occurrence of the color shift when the target curved-surface display region 11 of the target display panel 1 is viewed at the first viewing angle.

It should be appreciated that, the compensation for the aperture ratio of the second subpixel units within the target region of the target display panel is performed through merely fine adjustment of a value of the aperture ratio, i.e., a difference between an adjusted brightness value of white light emitted by each subpixel unit within the target region and a brightness value of white light emitted by each subpixel unit at a region other than the target region is merely about 20 nits, so it is difficult for the viewer to be aware of the difference between the adjusted brightness value of white light emitted by each subpixel unit within the target region and the brightness value of white light emitted by each subpixel unit at a region other than the target region even when the aperture ratio of the subpixel units within the target region of the target display panel is compensated, thereby further to improve the user experience.

The present disclosure further provides in some embodiments a display panel for which the color shift compensation is performed through the above-mentioned color shift compensation method. At least a part of the second subpixel units within the target region of the display panel may be provided with the target aperture ratio, so as to enable the brightness attenuation ratios corresponding to subpixel units in different colors within the target region to be the same when the target region is viewed at the first viewing angle, thereby to improve color shift within the target region when the target region is viewed at the first viewing angle.

When the color shift compensation is performed on the display panel through the above-mentioned color shift compensation method, at a development stage of the display panel, a test display panel may be manufactured using a conventional method in accordance with such parameters as a predetermined size, bending positions and bending angles. Then, the test region of the test display panel may be viewed at the first viewing angle so as to acquire the color shift information generated with respect to the test region.

Upon the acquisition of the color shift information, the aperture ratios of the subpixel units within the target region of the to-be-manufactured display panel (i.e., the target display panel in the embodiments of the present disclosure) may be determined in accordance with the color shift information. For example, at least a part of the second subpixel units within the target region of the to-be-manufactured display panel may be controlled to be provided with the target aperture ratio, and the subpixel units of the display panel other than at least the part of second subpixel units may be controlled to have a same aperture ratio as the respective subpixel units of the test display panel. After the determination of the aperture ratios of the subpixel units within the target region of the display panel, the subpixel units within the target region of the display panel may be formed in accordance with the aperture ratios of the subpixel units within the target region.

According to the display panel in the embodiments of the present disclosure, the color shift compensation may be performed through the above-mentioned color shift compensation method, so as to enable at least the part of subpixel units within the target region of the target display panel to be provided with the target aperture ratio, and enable the subpixel units in different colors within the target region to have the same brightness attenuation ratio when the target region is viewed at the first viewing angle. As a result, it is able to improve the color shift with respect to the subpixel units within the target region, and relieve or eliminate the color shift when the target display region of the target display panel is viewed by the user at the first viewing angle, thereby to effectively improve the user experience.

In some embodiments of the present disclosure, the display panel may include a pixel definition layer configured to define a plurality of aperture regions, and the subpixel units of the display panel may be arranged within the respective aperture regions. At least a part of the aperture regions defined by the pixel definition layer within the target region may have a target size, so as to enable at least the part of second subpixel units within at least the part of the aperture regions to be provided with the target aperture ratio.

To be specific, taking an OLED display panel as an example, during the formation of the subpixel units of the display panel, usually the pixel definition layer may be formed so as to define the plurality of aperture regions corresponding to the subpixel units respectively, and then the corresponding subpixel units may be formed at the aperture regions respectively. Hence, the aperture ratio of each subpixel unit may depend on a size of the corresponding aperture region.

During the manufacture of the display panel, at least the part of aperture regions defined by the pixel definition layer within the target region may be controlled to have the target size in accordance with the brightness attenuation ratios corresponding to the subpixel units in different colors within the test region, so as to enable at least the part of second subpixel units formed within at least the part of aperture regions to be provided with the target aperture ratio. In this way, it is able for the subpixel units in different colors within the target region to have the same brightness attenuation value when the target region is viewed at the first viewing angle, thereby to prevent the occurrence of the color shift within the target region of the target display panel when the target region is viewed at the first viewing angle.

In some embodiments of the present disclosure, at least red subpixel units, green subpixel units and blue subpixel units may be arranged within the target region. The red subpixel units within the target region may be provided with the target aperture ratio, or the green subpixel units within the target region may be provided with the target aperture ratio, or the blue subpixel units within the target region may be provided with the target aperture ratio.

To be specific, when the brightness attenuation ratio corresponding to the red subpixel units is minimum in the brightness attenuation ratios corresponding to the subpixel units in different colors within the test region, a reddish image may be viewed at the first viewing angle within the test region of the test display panel, so the red subpixel units within the target region may be controlled to be provided with the target aperture ratio which is smaller than the aperture ratio of the red subpixel units within the test region, so as to reduce a luminous brightness value of each red subpixel unit within the target region, thereby to enable the brightness attenuation ratios corresponding to the subpixel units in different colors within the target region of the target display panel to be the same when the subpixel units in different colors within the target region is viewed at the first viewing angle. As a result, it is able to prevent the image displayed within the target region from being reddish when the target region of the target display panel is viewed at the first viewing angle.

When the brightness attenuation ratio corresponding to the green subpixel units is minimum in the brightness attenuation ratios corresponding to the subpixel units in different colors within the test region, a greenish image may be viewed at the first viewing angle within the test region of the test display panel, so the green subpixel units within the target region may be controlled to be provided with the target aperture ratio which is smaller than the aperture ratio of the green subpixel units within the test region, so as to reduce a luminous brightness value of each green subpixel unit within the target region, thereby to enable the brightness attenuation ratios corresponding to the subpixel units in different colors within the target region of the target display panel to be the same when the subpixel units in different colors within the target region is viewed at the first viewing angle. As a result, it is able to prevent the image displayed within the target region from being greenish when the target region of the target display panel is viewed at the first viewing angle.

When the brightness attenuation ratio corresponding to the blue subpixel units is minimum in the brightness attenuation ratios corresponding to the subpixel units in different colors within the test region, a bluish image may be viewed at the first viewing angle within the test region of the test display panel, so the blue subpixel units within the target region may be controlled to be provided with the target aperture ratio which is smaller than the aperture ratio of the blue subpixel units within the test region, so as to reduce a luminous brightness value of each blue subpixel unit within the target region, thereby to enable the brightness attenuation ratios corresponding to the subpixel units in different colors within the target region of the target display panel to be the same when the subpixel units in different colors within the target region is viewed at the first viewing angle. As a result, it is able to prevent the image displayed within the target region from being bluish when the target region of the target display panel is viewed at the first viewing angle.

In some embodiments of the present disclosure, the display panel may include a target flat-surface display region and a target curved-surface display region, and the target region may include the target flat-surface display region or the target curved-surface display region. The first viewing angle may include a sum of a viewing angle at which the target region is viewed and a bending angle corresponding to the target region, and the bending angle may be an angle of a middle tangent plane of a curved surface corresponding to the target region relative to a plane corresponding to the target flat-surface display region.

To be specific, when the color shift compensation is performed on the display panel through the above-mentioned color shift compensation method, and the image displayed within the test region of the test display panel is viewed by the viewer, the generated color shift may be associated with the viewing angle at which the test region is viewed by the viewer and the bending angle corresponding to the test region. The bending angle may be an angle of the middle tangent plane of the curved surface corresponding to the test region relative to the plane corresponding to the test flat-surface display region. Hence, upon the acquisition of the viewing angle and the bending angle, the first viewing angle may be acquired through adding the viewing angle to the bending angle, and then the color shift information generated with respect to the test region when the test region is viewed at the first viewing angle may be acquired.

In this regard, after the acquisition of the color shift information generated with respect to the test region when the test region is viewed at the first viewing angle, at least the part of second subpixel units within the target region of the display panel may be compensated in accordance with the color shift information, so as to enable at least the part of second subpixel units within the target region to be provided with the target aperture ratio, thereby to effectively improve the color shift when the target region is viewed by the viewer at the first viewing angle.

It should be appreciated that, because the display panel in the embodiments of the present disclosure (i.e., the target display panel) has a same size, same bending positions and same bending angles as the test display panel, the target flat-surface display region of the display panel may have a same size and a same position as the test flat-surface display region of the test display panel, and the target curved-surface display region of the display panel may have a same size and a same position as the test curved-surface display region of the test display panel.

In addition, because the first viewing angle at which the test region of the test display panel is viewed includes a sum of the viewing angle at which the test region is viewed and the bending angle corresponding to the test region, the first viewing angle at which the target region of the target display panel is viewed may include a sum of the viewing angle at which is the target region is viewed and the bending angle corresponding to the target region. The bending angle may include an angle of the middle tangent plane of the curved surface corresponding to the target region relative to the plane corresponding to the target flat-surface display region. In addition, the viewing angle at which the test region of the test display panel is viewed may be the same as the viewing angle at which the target region of the display panel is viewed.

As mentioned above, the first viewing angle may be acquired through adding the viewing angle to the bending angle, so both the viewing angle of the viewer and the bending angle of the test region may be taken into consideration during the acquisition of the color shift information in accordance with the first viewing angle. In this way, when compensating for the second subpixel units within the target region of the display panel in accordance with the color shift information, it is able to compensate for the color shift generated due to the viewing angle and the color shift generated due to the bending angle, thereby further improve the user experience.

In some embodiments of the present disclosure, when the target region includes the target flat-surface display region, the bending angle may be 0°, and the first viewing angle may be equal to the viewing angle.

To be specific, when the color shift compensation is performed on the display panel through the color shift compensation method and the test region includes the test flat-surface display region, because the test flat-surface display region is flat, the bending angle corresponding to the test flat-surface display region may be 0°, i.e., the color shift viewed by the viewer may be merely associated with the viewing angle, and it may be determined that the viewing angle may be just the first viewing angle. Next, the color shift information generated with respect to the test flat-surface display region of the test display panel when the test flat-surface display region is viewed at the first viewing angle may be acquired. Then, the aperture ratio of the second subpixel units within the target flat-surface display region of the target display panel may be compensated in accordance with the color shift information, so as to prevent the occurrence of the color shift when the target flat-surface display region of the display panel is viewed at the first viewing angle, thereby effectively improve the user experience.

It should be appreciated that, after the compensation, when the display panel is viewed at the first viewing angle, the first viewing angle may be equal to the viewing angle at which the test region is viewed at a testing stage.

In some embodiments of the present disclosure, when the target region is the target curved-surface display region, it may determines that the viewing angle at which the target curved-surface display region is viewed may be 0°, and the first viewing angle may be equal to the bending angle.

To be specific, the viewing angle may be uncertain when the target curved-surface display region of the display panel is viewed by the viewer. Hence, at the testing stage, the first viewing angle may be determined as being equal to the bending angle, the corresponding color shift information may be acquired in accordance with the first viewing angle, and then the second subpixel units within the target curved-surface display region of the display panel maybe compensated in accordance with the color shift information. In this way, it is able to prevent the occurrence of the color shift when the target curved-surface display region of the display panel is viewed at the first viewing angle, thereby to improve the user experience.

It should be appreciated that, after the compensation, when the display panel is viewed at the first viewing angle, the first viewing angle may be equal to the bending angle.

The present disclosure further provides in some embodiments a display device including the above-mentioned display panel.

As mentioned above, the display panel may include the target region, and when the target region of the display panel is viewed by the user at the first viewing angle, it is able to prevent the occurrence of the color shift, thereby to effectively improve the user experience. Hence, when the display device includes the above-mentioned display panel, it is able to achieve the above-mentioned beneficial effect, which will not be particularly defined herein.

It should be appreciated that, the display device may be any product or member having a display function, e.g., television, display, digital photo frame, mobile phone or flat-panel computer. The display device may further include a flexible circuit board, a printed circuit board, a back plate, and the like.

It should be further appreciated that, the above embodiments have been described in a progressive manner, and the same or similar contents in the embodiments have not been repeated, i.e., each embodiment has merely focus on the difference from the others. Especially, the product embodiments are substantially similar to the method embodiments, and thus have been described in a simple manner; for a detailed description thereof, it may refer to the related portion in the method embodiments.

Unless otherwise defined, any technical or scientific term used herein shall have the common meaning understood by a person skilled in the arts. Such words as "first" and "second" used in the present disclosure are merely used to differentiate different components rather than to represent any order, number or importance. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials, or characteristics may be combined in any embodiment or embodiments in an appropriate manner.

The above embodiments are for illustrative purposes only, but the present disclosure is not limited thereto. A person skilled in the art may make further modifications and substitutions without departing from the principle of the present disclosure, and these modifications and substitutions shall also fall within the scope of the present disclosure. Thus, a protect scope of the present disclosure shall be defined by the attached claims.

The invention claimed is:

1. A color shift compensation method, comprising:
    acquiring color shift information generated with respect to a test region of a test display panel when the test region is viewed at a first viewing angle, at least a part of first subpixel units within the test region being provided with a test aperture ratio; and
    in response to the color shift information indicating excessive brightness of at least one color, manufacturing at least a part of second subpixel units within a target region of a target display panel to have a target aperture ratio smaller than the test aperture ratio in order to attenuate the brightness of at least part of the second subpixel unit associated with the at least one color, the attenuated brightness improving color shift within the target region when the target region is viewed at the first viewing angle,
    wherein a position of the target region on the target display panel is same as a position of the test region on the test display panel, and positions of at least the part of second subpixel units within the target region are same as positions of at least the part of first subpixel units within the test region,
    wherein a curved display surface of the test display panel is same as a curved display surface of the target display panel.

2. The color shift compensation method according to claim 1, wherein the acquiring the color shift information generated with respect to the test region of the test display panel when the test region is viewed at the first viewing angle comprises:
    determining brightness attenuation ratios corresponding to the subpixel units in different colors within the test region when the test region is viewed at the first viewing angle.

3. The color shift compensation method according to claim 2, wherein manufacturing at least the part of second subpixel units within the target region of the target display panel to have the target aperture ratio smaller than the test aperture ratio comprises:
    controlling at least the part of second subpixel units within the target region to have the target aperture ratio in accordance with the brightness attenuation ratios corresponding to the subpixel units in different colors within the test region, to enable the brightness attenuation ratios corresponding to the subpixel units in different colors within the target region to be same when the target region is viewed at the first viewing angle.

4. The color shift compensation method according to claim 3, wherein the target display panel comprises a pixel definition layer configured to define a plurality of aperture regions, and the subpixel units of the target display panel are arranged within the aperture regions respectively,
    wherein the controlling at least the part of the second subpixel units within the target region to have the target aperture ratio in accordance with the brightness attenuation ratios corresponding to the subpixel units in different colors within the test region comprises:
    controlling at least a part of the aperture regions defined by the pixel definition layer within the target region to have a target size in accordance with the brightness attenuation ratios corresponding to the subpixel units in different colors within the test region, to enable at least the part of second subpixel units within at least the part of the aperture regions to have the target aperture ratio.

5. The color shift compensation method according to claim 3, wherein the manufacturing at least the part of second subpixel units within the target region of the target display panel to have the target aperture ratio smaller than the test aperture ratio comprises:

when the brightness attenuation ratio corresponding to the first subpixel units is minimum among the brightness attenuation ratios corresponding to the subpixel units in different colors within the test region, controlling the second subpixel units within the target region to have the target aperture ratio being smaller than the test aperture ratio of the first subpixel units.

6. The color shift compensation method according to claim 5, wherein at least red subpixel units, green subpixel units and blue subpixel units are arranged within each of the test region and the target region, wherein both the first subpixel units and the second subpixel units comprise the red subpixel units; or both the first subpixel units and the second subpixel units comprise the green subpixel units; or both the first subpixel units and the second subpixel units comprise the blue subpixel units.

7. The color shift compensation method according to claim 1, wherein the test display panel comprises a test flat-surface display region and a test curved-surface display region, and the test region comprises the test flat-surface display region or the test curved-surface display region, wherein the acquiring the color shift information generated with respect to the test region of the test display panel when the test region is viewed at the first viewing angle comprises:

determining a viewing angle at which the test region is viewed and a bending angle corresponding to the test region, the bending angle comprising an angle of a middle tangent plane of a curved surface corresponding to the test region relative to a plane corresponding to the test flat-surface display region;

acquiring the first viewing angle in accordance with the viewing angle and the bending angle; and acquiring the color shift information generated with respect to the test region when the test region is viewed at the first viewing angle.

8. The color shift compensation method according to claim 7, wherein the acquiring the first viewing angle in accordance with the viewing angle and the bending angle comprises:

acquiring the first viewing angle through adding the viewing angle to the bending angle.

9. The color shift compensation method according to claim 8, wherein when the test region comprises the test flat-surface display region, the bending angle is 0°, and the first viewing angle is equal to the viewing angle.

10. The color shift compensation method according to claim 8, wherein when the test region comprises the test curved-surface display region, determining that the viewing angle at which the test curved-surface display region is viewed is 0°, and the first viewing angle is equal to the bending angle.

11. A display panel manufactured through the color shift compensation method according to claim 1, wherein at least a part of second subpixel units within a target region of the display panel has a target aperture ratio, to enable brightness attenuation ratios corresponding to subpixel units in different colors within the target region to be the same when the target region is viewed at a first viewing angle, to improve color shift within the target region when the target region is viewed at the first viewing angle, wherein the display panel comprises a target flat-surface display region and a target curved-surface display region, and the target region comprises the target flat-surface display region or the target curved-surface display region, wherein the first viewing angle comprises a sum of a viewing angle at which the target region is viewed and a bending angle corresponding to the target region, and the bending angle is an angle of a middle tangent plane of a curved surface corresponding to the target region relative to a plane corresponding to the target flat-surface display region.

12. The display panel according to claim 11, wherein the display panel further comprises a pixel definition layer configured to define a plurality of aperture regions, the subpixel units of the display panel are arranged within the aperture regions respectively, and at least a part of the aperture regions defined by the pixel definition layer within the target region has a target size, to enable at least the part of second subpixel units within at least the part of the aperture regions to have the target aperture ratio.

13. The display panel according to claim 11, wherein at least red subpixel units, green subpixel units and blue subpixel units are arranged within the target region, wherein the red subpixel units within the target region are provided with the target aperture ratio; or the green subpixel units within the target region are provided with the target aperture ratio; or the blue subpixel units within the target region are provided with the target aperture ratio.

14. The display panel according to claim 11, wherein when the target region comprises the target flat-surface display region, the bending angle is 0°, and the first viewing angle is equal to the viewing angle.

15. The display panel according to claim 11, wherein when the target region comprises the target curved-surface display region, the viewing angle at which the target curved-surface display region is determined to be viewed is 0°, and the first viewing angle is determined to be equal to the bending angle.

16. A display device, comprising the display panel according to claim 11.

17. The display device according to claim 16, wherein the display panel further comprises a pixel definition layer configured to define a plurality of aperture regions, the subpixel units of the display panel are arranged within the aperture regions respectively, and at least a part of the aperture regions defined by the pixel definition layer within the target region has a target size, to enable at least the part of second subpixel units within at least the part of the aperture regions to have the target aperture ratio.

18. The display device according to claim 16, wherein at least red subpixel units, green subpixel units and blue subpixel units are arranged within the target region, wherein the red subpixel units within the target region are provided with the target aperture ratio; or the green subpixel units within the target region are provided with the target aperture ratio; or the blue subpixel units within the target region are provided with the target aperture ratio.

* * * * *